United States Patent
Huang et al.

(10) Patent No.: US 12,538,543 B2
(45) Date of Patent: *Jan. 27, 2026

(54) METHODS OF MANUFACTURE OF SEMICONDUCTOR DEVICES

(71) Applicant: Taiwan Semiconductor Manufacturing Co., Ltd., Hsinchu (TW)

(72) Inventors: Chun-Hsien Huang, Hsinchu (TW); Chang-Ting Chung, Hsinchu (TW); Wei-Cheng Lin, Tainan (TW); Wei-Jung Lin, Hsinchu (TW); Chih-Wei Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/447,053

(22) Filed: Aug. 9, 2023

(65) Prior Publication Data
US 2023/0387221 A1 Nov. 30, 2023

Related U.S. Application Data

(60) Division of application No. 17/392,320, filed on Aug. 3, 2021, now Pat. No. 11,973,117, which is a (Continued)

(51) Int. Cl.
*H10D 64/01* (2025.01)
*H01L 21/02* (2006.01)
(Continued)

(52) U.S. Cl.
CPC ....... *H10D 64/01* (2025.01); *H01L 21/02063* (2013.01); *H01L 21/02164* (2013.01); (Continued)

(58) Field of Classification Search
CPC ............ H01L 29/401; H01L 21/02063; H01L 21/02164; H01L 21/02238; (Continued)

(56) References Cited

U.S. PATENT DOCUMENTS 5,470,790 A * 11/1995 Myers ............... H01L 21/76805
257/E23.145
6,306,737 B1 10/2001 Mehrad et al.
(Continued)

*Primary Examiner* — Duy T Nguyen
(74) *Attorney, Agent, or Firm* — Slater Matsil, LLP

(57) ABSTRACT

Methods of forming contacts for source/drain regions and a contact plug for a gate stack of a finFET device are disclosed herein. Methods include etching a contact opening through a dielectric layer to expose surfaces of a first source/drain contact and repairing silicon oxide structures along sidewall surfaces of the contact opening and along planar surfaces of the dielectric layer to prevent selective loss defects from occurring during a subsequent selective deposition of conductive fill materials and during subsequent etching of other contact openings. The methods further include performing a selective bottom-up deposition of conductive fill material to form a second source/drain contact. According to some of the methods, once the second source/drain contact has been formed, the contact plug may be formed over the gate stack.

20 Claims, 9 Drawing Sheets

Related U.S. Application Data continuation of application No. 16/387,043, filed on Apr. 17, 2019, now Pat. No. 11,101,353.

(51) Int. Cl.

| | | |
|---|---|---|
| *H01L 21/285* | (2006.01) | |
| *H01L 21/3065* | (2006.01) | |
| *H01L 21/311* | (2006.01) | |
| *H01L 21/321* | (2006.01) | |
| *H01L 21/768* | (2006.01) | |
| *H10D 30/01* | (2025.01) | |
| *H10D 30/62* | (2025.01) | |
| *H10D 30/69* | (2025.01) | |
| *H10D 62/13* | (2025.01) | |

(52) U.S. Cl.
CPC .. *H01L 21/02238* (2013.01); *H01L 21/28568* (2013.01); *H01L 21/31116* (2013.01); *H01L 21/76802* (2013.01); *H01L 21/76826* (2013.01); *H01L 21/76879* (2013.01); *H10D 30/024* (2025.01); *H10D 30/6219* (2025.01); H01L 21/02532 (2013.01); H01L 21/02636 (2013.01); H01L 21/3065 (2013.01); H01L 21/3212 (2013.01); H01L 21/7684 (2013.01); H10D 30/797 (2025.01); H10D 62/151 (2025.01); H10D 64/017 (2025.01)

(58) Field of Classification Search
CPC ......... H01L 21/28568; H01L 21/31116; H01L 21/76802; H01L 21/76826; H01L 21/76879; H01L 29/41791; H01L 29/66795; H01L 21/02532; H01L 21/02636; H01L 21/3065; H01L 21/3212; H01L 21/7684; H01L 29/0847; H01L 29/66545; H01L 29/7848; H01L 21/76805; H01L 21/76814; H01L 21/76877; H10D 64/01; H10D 30/024; H10D 30/6219; H10D 30/797; H10D 62/151; H10D 64/017; H10D 64/117; H10D 64/252; B65D 83/141; H10F 30/2857; H10F 55/20

USPC ........................................................ 438/667
See application file for complete search history.

(56) References Cited

U.S. PATENT DOCUMENTS

| | | | |
|---|---|---|---|
| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2003/0067031 | A1 | 4/2003 | Leung et al. |
| 2003/0194872 | A1* | 10/2003 | Parikh ............... H01L 21/76868 257/E21.585 |
| 2003/0236003 | A1* | 12/2003 | Koo .................. H01L 21/76862 438/653 |
| 2004/0090734 | A1* | 5/2004 | Lian ....................... H10B 12/37 257/E21.651 |
| 2006/0121657 | A1 | 6/2006 | Zhang |
| 2006/0183346 | A1 | 8/2006 | Liu |
| 2006/0246738 | A1 | 11/2006 | Isobe et al. |
| 2007/0099414 | A1 | 5/2007 | Frohberg et al. |
| 2010/0136758 | A1 | 6/2010 | Ogawa et al. |
| 2010/0230679 | A1* | 9/2010 | Kim ..................... H01L 27/124 257/E29.291 |
| 2012/0056270 | A1* | 3/2012 | Fujita ................. H01L 29/4983 257/369 |
| 2012/0119307 | A1 | 5/2012 | Li et al. |
| 2014/0084340 | A1 | 3/2014 | Wang et al. |
| 2014/0124842 | A1 | 5/2014 | Wang et al. |
| 2016/0043035 | A1 | 2/2016 | Lin et al. |
| 2016/0225868 | A1* | 8/2016 | Kim .................. H10D 84/0158 |
| 2018/0130871 | A1* | 5/2018 | Lin ......................... H01L 28/88 |
| 2019/0103491 | A1 | 4/2019 | Chan et al. |
| 2020/0098922 | A1 | 3/2020 | You et al. |

\* cited by examiner

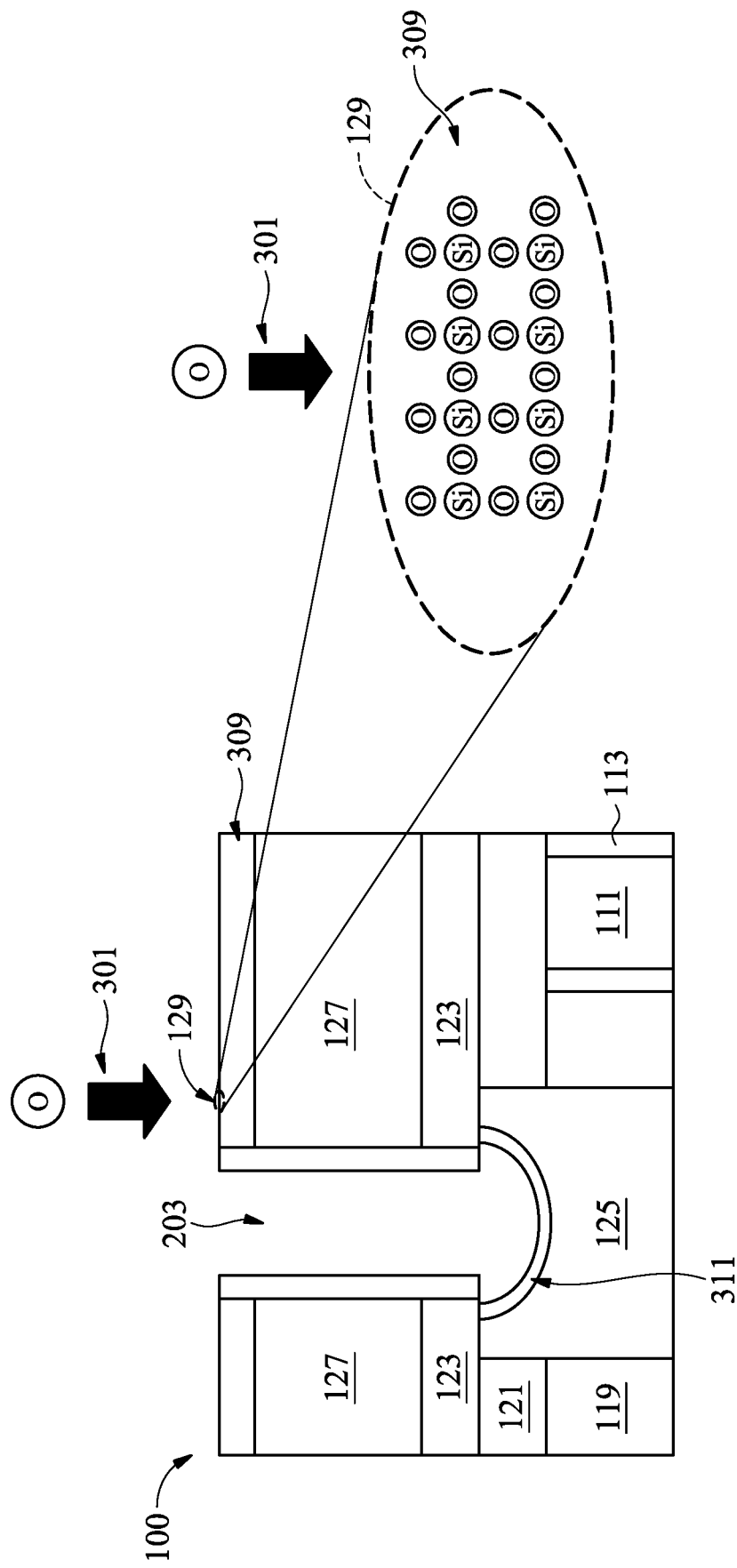

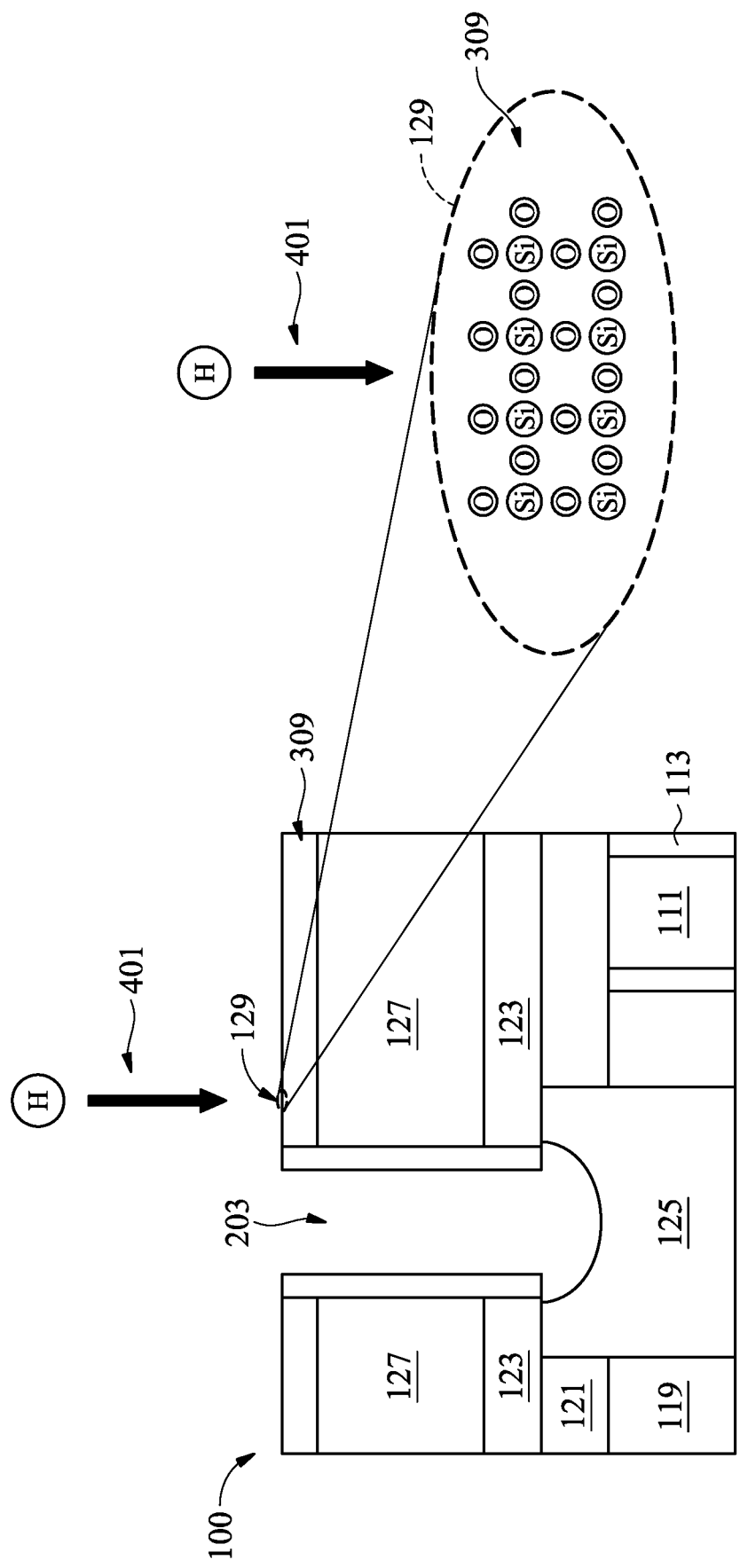

METHODS OF MANUFACTURE OF SEMICONDUCTOR DEVICES

PRIORITY CLAIM

This application is a divisional of U.S. patent application Ser. No. 17/392,320, filed on Aug. 3, 2021, entitled "Semiconductor Device," now U.S. Pat. No. 11,973,117, which is a continuation of U.S. patent application Ser. No. 16/387,043 filed on Apr. 17, 2019, entitled "Semiconductor Device and Method of Manufacture," now U.S. Pat. No. 11,101,353, issued on Aug. 24, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-8B illustrate, in cross-sectional views and in atomic level views, some intermediate steps in forming source/drain contacts and a gate contact during further processing of the finFET device, in accordance with some embodiments.

DETAILED DESCRIPTION

Figure 1A:
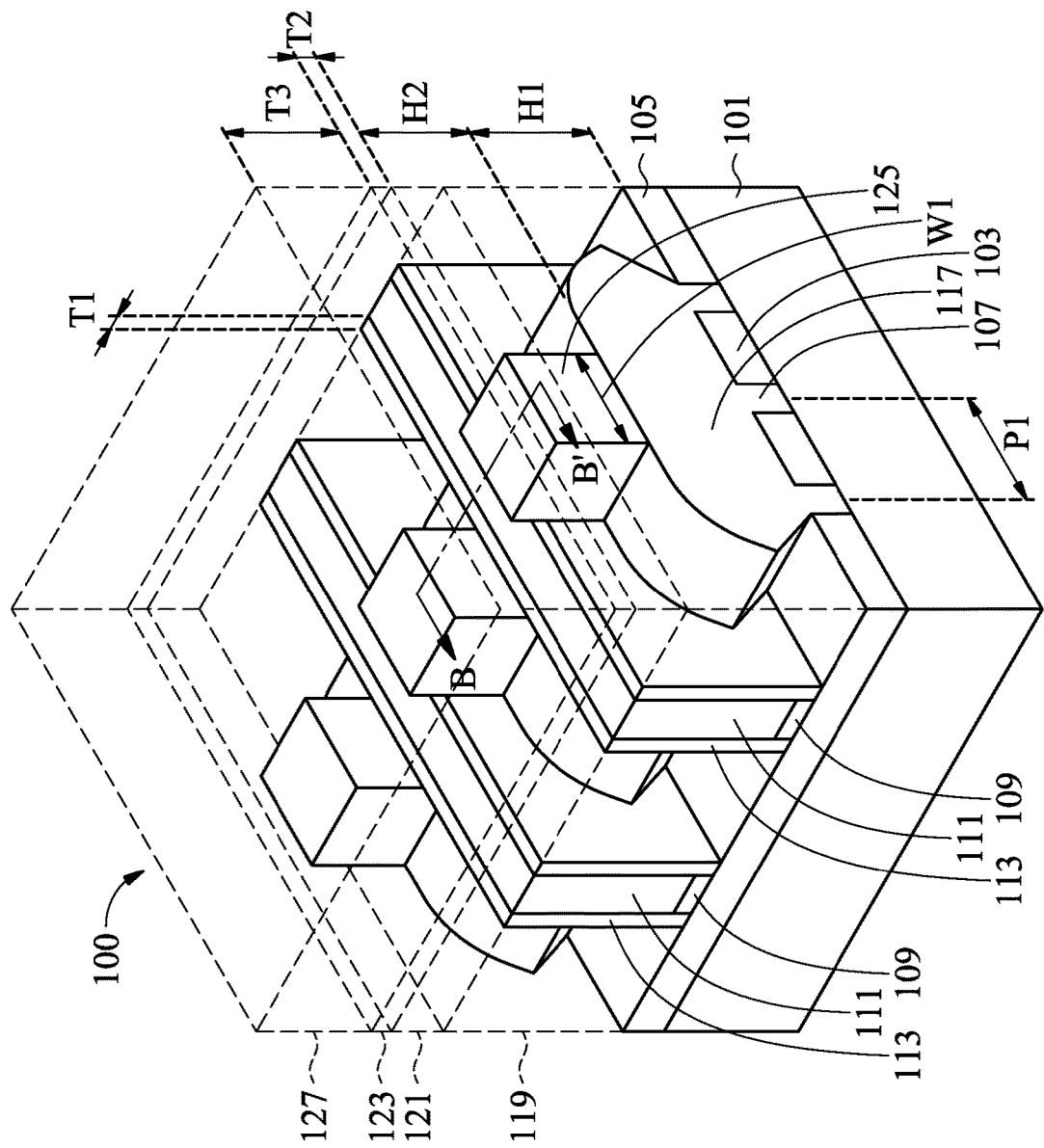
FIGS. 1A-1C illustrate a perspective view of a finFET device, a cross-sectional view of the finFET device, and a magnified atomic level view of a surface point of a planarized surface of the cross-sectional view of the finFET device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1A, there is illustrated a perspective view of a finFET device 100. In an embodiment, the finFET device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1A) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms the fins 107 from those portions of the substrate 101 that remain unremoved. For convenience the fins 107 have been illustrated in the figures as being separated from the substrate 101, although a physical indication of the separation may or may not be present. The fins 107 may be used, as discussed below, to form the channel region of multiple-gate FinFET transistors. While FIG. 1 only illustrates three of the fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other and have a pitch P1 of between about 10 nm and about 100 nm, such as about 50 nm. By spacing the fins 107 in such a fashion, the fins 107 may each form a separate channel region while still being close enough to share a common gate (discussed further below).

The fins 107 may be patterned by any suitable method. For example, the fins 107 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 107.

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as hydrogen ($H_2$), and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, gate dielectrics 109, dummy gate electrodes over the gate dielectrics 109, and first spacers 113 may be formed over each of the fins 107. In an embodiment the gate dielectrics 109 may be formed by thermal oxidation, chemical vapor deposition, sputtering, or any other suitable methods for forming the gate dielectrics 109. Depending on the technique used to form the gate dielectrics 109, the thickness of the gate dielectrics 109 on the top of the fins 107 may be different from the thickness of the gate dielectrics 109 on the sidewall of the fins 107.

The gate dielectrics 109 may comprise a material such as silicon dioxide or silicon oxynitride with a thickness ranging from between about 3 Å and about 100 Å, such as about 10 Å. The gate dielectrics 109 may be formed from a high permittivity (high-k) material (e.g., with a relative permittivity being greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å, such as about 10 Å or less. Additionally, any combination of silicon dioxide, silicon oxynitride, and/or high-k materials may also be used to form the gate dielectrics 109.

The dummy gate electrodes may comprise a conductive material and may be selected from a group comprising of polysilicon, W, Al, Cu, AlCu, Ti, TiAlN, TaC, TaCN, TaSiN, Mn, Zr, TiN, Ta, TaN, Co, Ni, combinations of these, or the like. The dummy gate electrodes may be deposited by chemical vapor deposition (CVD), sputter deposition, or other techniques known and used in the art for depositing conductive materials. The thickness of the dummy gate electrodes may be in the range of about 5 Å to about 200 Å. The top surface of the dummy gate electrodes may have a non-planar top surface, and may be planarized prior to patterning of the dummy gate electrodes or gate etch. Ions may or may not be introduced into the dummy gate electrodes at this point. Ions may be introduced, for example, by ion implantation techniques.

Once formed, the gate dielectrics 109 and the dummy gate electrodes may be patterned to form a series of dummy stacks over the fins 107. The dummy stacks define multiple channel regions located on each side of the fins 107 beneath the gate dielectrics 109. The dummy stacks may be formed by depositing and patterning a dummy gate mask (not separately illustrated in FIG. 1A) over the dummy gate electrodes using, for example, any suitable deposition and photolithography techniques. The dummy gate mask may incorporate any suitable masking and sacrificial materials, such as (but not limited to) silicon oxide, silicon oxynitride, SiCON, SiC, SiOC, and/or silicon nitride and may be deposited to a thickness of between about 5 Å and about 200

Å. The dummy gate electrodes and the gate dielectrics 109 may be etched using a dry etching process to form the patterned dummy stacks.

Once the dummy stacks have been patterned, the first spacers 113 may be formed. The first spacers 113 may be formed on opposing sides of the dummy stacks. The first spacers 113 may be formed by blanket depositing a spacer layer (not separately illustrated in FIG. 1A) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and any other suitable methods. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113. In an embodiment the first spacers 113 may be formed to have a first thickness T1 of between about 5 Å and about 500 Å.

FIG. 1A further illustrates a removal of the fins 107 from those areas not protected by the dummy stacks and the first spacers 113 and a regrowth of source/drain regions 117. The removal of the fins 107 from those areas not protected by the dummy stacks and the first spacers 113 may be performed by a reactive ion etch (RIE) using the dummy stacks and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrodes to prevent growth over the dummy gate electrodes. Once the dummy gate electrodes are covered, the source/drain regions 117 may be regrown in contact with each of the fins 107. In an embodiment the source/drain regions 117 may be regrown and, in some embodiments the source/drain regions 117 may be regrown to form a stressor that will impart a stress to the channel regions of the fins 107 located underneath the dummy stacks. In an embodiment wherein the fins 107 comprise silicon and the FinFET is a p-type device, the source/drain regions 117 may be regrown through a selective epitaxial process with a material, such as silicon or else a material such as silicon germanium that has a different lattice constant than the channel regions. In other embodiments the source/drain regions 117 may comprise materials such as GaAs, GaP, GaN, InP, InAs, InSb, GaAsP, AlGaN, AlInAs, AlGaAs, GaInAs, GaInP, GaInAsP, combinations of these, or the like. The epitaxial growth process may use precursors such as silane, dichlorosilane, germane, and the like, and may continue for between about 5 minutes and about 120 minutes, such as about 30 minutes.

In an embodiment the source/drain regions 117 may be formed to have a thickness of between about 5 Å and about 1000 Å, and may have a first height H1 over the first isolation regions 105. In this embodiment, the source/drain regions 117 may be formed to the first height H1 of between about 5 nm and about 250 nm, such as about 100 nm. However, any suitable height may be utilized.

Once the source/drain regions 117 are formed, dopants may be implanted into the source/drain regions 117 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the dummy stacks and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any suitable process or any suitable combination of processes may be used to implant the dopants, and the above description is not meant to limit the present embodiments to the steps presented above.

Additionally at this point the hard mask that covered the dummy gate electrodes during the formation of the source/drain regions 117 is removed. In an embodiment the hard mask may be removed using, e.g., a wet or dry etching process that is selective to the material of the hard mask. However, any suitable removal process may be utilized.

It is noted that FIG. 1A illustrates an embodiment in which the source/drain regions 117 of adjacent fins merge together such that a portion of the first isolation regions 105 remains between adjacent fins. In some embodiments, the first isolation regions 105 may be completely removed prior to epitaxially growing the source/drain regions 117. Additionally, in some embodiments, the source/drain regions 117 may not merge, thereby providing embodiments in which the epitaxial materials of the source/drain regions 117 over the adjacent fins are separate and distinct.

FIG. 1A also illustrates a formation of a first inter-layer dielectric (ILD) layer 119 (illustrated in dashed lines in FIG. 1A in order to more clearly illustrate the underlying structures) over the source/drain regions 117. The first ILD layer 119 may comprise a material such as boron phosphorous silicate glass (BPSG), although any suitable dielectrics may be used. The first ILD layer 119 may be formed using a process such as PECVD, although other processes, such as LPCVD, may alternatively be used. The first ILD layer 119 may be formed to a thickness of between about 100 Å and about 3,000 Å. Once formed, the first ILD layer 119 may be planarized using, e.g., a planarization process such as a chemical mechanical planarization (CMP) process, although any suitable process may be utilized. According to some embodiments, the first ILD layer 119 is planarized with the first spacers 113 using, e.g., a planarization process such as chemical mechanical polishing process, although any suitable process may be utilized.

After the formation of the first ILD layer 119, the material of the dummy gate electrodes may be removed and replaced to form gate stacks 111 over the gate dielectrics 109. In an embodiment the dummy gate electrodes may be removed using, e.g., a wet or dry etching process that utilizes etchants that are selective to the material of the dummy gate electrodes. However, any suitable removal process may be utilized.

Once the dummy gate electrodes have been removed, the openings left behind may be refilled to form the gate stacks 111. In a particular embodiment the gate stacks 111 comprise a first dielectric material, a first metal material, a second metal material, and a third metal material. For clarity reasons, the dielectric and metal materials of the gate stacks 111 are not separately illustrated in FIG. 1A.

In an embodiment the first dielectric material is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material may be deposited to a thickness of between about 5 Å and about 200 Å, although any suitable material and thickness may be utilized.

The first metal material may be formed adjacent to the first dielectric material and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a thickness of between about 5 Å and about 200 Å, although any suitable deposition process or thickness may be used.

The second metal material may be formed adjacent to the first metal material and, in a particular embodiment, may be similar to the first metal material. For example, the second metal material may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material may be deposited using a deposition process such as atomic layer deposition, chemical vapor deposition, sputtering, or the like, to a thickness of between about 5 Å and about 200 Å, although any suitable deposition process or thickness may be used.

The third metal material fills a remainder of the opening left behind by the removal of the dummy gate electrode. In an embodiment the third metal material is a metallic material such as W, Al, Cu, AlCu, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode. In a particular embodiment the third metal material may be deposited to a thickness of between about 5 Å and about 500 Å, although any suitable material, deposition process, and thickness may be utilized.

Once the opening left behind by the removal of the dummy gate electrode has been filled, the materials may be planarized in order to remove any material that is outside of the opening left behind by the removal of the dummy gate electrode. In a particular embodiment the removal may be performed using a planarization process such as chemical mechanical polishing until the gate stacks 111 are planar with the first spacers 113. However, any suitable planarization and removal process may be utilized.

According to some embodiments, after the materials of the gate stacks 111 have been formed and planarized, an optional capping layer may be formed over the materials of the gate stacks 111. The optional capping layer may be formed by recessing the materials of the gate stacks 111 and depositing a capping material in the recesses of the gate stacks 111. In an embodiment the materials of the gate stacks 111 may be recessed using, e.g., a wet or dry etching process that utilizes etchants selective to the materials of the gate stacks 111. However, any suitable process and distance may be utilized.

Once the materials of the gate stacks 111 have been recessed, the optional capping layer may be deposited and planarized with the first spacers 113. In an embodiment the optional capping layer is a material such as SiN, SiON, SiCON, SiC, SiOC, combinations of these, or the like, deposited using a deposition process such as atomic layer deposition, chemical vapor deposition, sputtering, or the like. The optional capping layer may be deposited to a thickness of between about 5 Å and about 200 Å, and then planarized using a planarization process such as chemical mechanical polishing such that the optional capping layer is planar with the first spacers 113.

Once the first ILD layer 119 has been planarized with the first spacers 113, a second ILD layer 121 may be formed over the first ILD layer 119 and then planarized to a desired second height (e.g., H2) above the source/drain regions 117. The second ILD layer 121 may comprise a same material (e.g., BPSG) and may be formed using a same process (e.g., PECVD or LPCVD) as used to form the first ILD layer 119; however, they may also be different and any suitable dielectric materials and any suitable deposition processes may be used to form the second ILD layer 121. According to some embodiments, the second ILD layer 121 may be formed to a thickness of between about 100 Å and about 3,000 Å. Once formed, the second ILD layer 121 may be planarized to the desired second height H2 above the source/drain regions 117 using, e.g., a planarization process such as a chemical mechanical planarization (CMP) process, although any suitable process may be utilized. According to some embodiments, the second ILD layer 121 may be planarized to the desired second height H2 of between about 20 nm and about 50 nm, such as about 30 nm. However any suitable height may be used.

Once the second ILD layer 121 has been planarized, first contact openings may be formed through the second ILD layer 121 and the first ILD layer 119 in order to expose contact areas of the source/drain regions 117 in preparation for forming source/drain contacts 125. In an embodiment the first contact openings may be formed by initially placing and patterning a first photoresist over the source/drain regions 117. In an embodiment the first photoresist is a tri-layer photoresist, with a bottom anti-reflective coating (BARC) layer, an intermediate mask layer, and a top photoresist layer. However, any suitable type of photosensitive material or combination of materials may be utilized.

Once the first photoresist has been placed, the first photoresist is patterned. In an embodiment the first photoresist may be patterned by exposing a photosensitive material within the first photoresist (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the first photoresist are different from the physical properties of the unexposed portions of the first photoresist. The first photoresist may then be developed with, e.g., a developer, in order to separate the exposed portion of the first photoresist from the unexposed portion of the first photoresist.

In an embodiment the first photoresist is patterned to form an opening that exposes portions of the second ILD layer 121 in desired areas over the source/drain regions 117 for the first contact openings to be formed. Once the first photoresist has been patterned, the first contact openings may be formed using the first photoresist as a mask. In an embodiment the first contact openings may be formed using a first etching process, which may be an anisotropic etching process such as a reactive ion etching (RIE) process. However, any suitable process, such as a wet etching process, and any suitable reactants may be used.

The first etching process may be utilized to form the first contact openings in preparation for formation of the source/drain contacts 125. In a particular embodiment the first etching process may be utilized to remove the materials of the second ILD layer 121 and the first ILD layer 119 in order to form the first contact openings to a first width W1 and to expose desired contact areas on the surfaces of the source/drain regions 117. In some embodiments, the first contact openings may have a first width W1 of between about 10 nm and about 100 nm, such as about 25 nm. However, any suitable dimensions may be utilized.

Once the first contact openings have been formed, the first photoresist may be removed using, e.g., an ashing process, whereby a temperature of the first photoresist is increased until the first photoresist undergoes a thermal decomposition, at which point the first photoresist may be easily removed. However, any suitable removal process, such as a wet etch, may also be utilized.

FIG. 1A further illustrates the formation of the source/drain contacts 125. Once the first openings have been formed, the source/drain contacts 125 may be formed in the first contact openings.

According to some embodiments, an optional silicide contact may be formed from the upper surface of the source/drain regions 117 prior to formation of the source/drain contacts 125. The optional silicide contact may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the optional silicide contact may be between about 5 Å and about 2000 Å.

Once the optional silicide contact has been formed, the source/drain contacts 125 are formed. In an embodiment the source/drain contacts 125 may be a conductive material such as Co, W, Al, Cu, Ti, Ta, Ru, TiN, TiAl, TiAlN, TaN, TaC, NiSi, CoSi, alloys of these, combinations of these, or the like, and may be deposited using a deposition process such as sputtering, chemical vapor deposition, electroplating, electroless plating, or the like, to fill and/or overfill the first contact openings. Once filled or overfilled, any deposited material outside of the first contact openings may be removed using a planarization process such as chemical mechanical polishing (CMP). However, any suitable material and process of formation may be utilized.

Once the source/drain contacts 125 have been formed, an etch stop layer 123 and a third ILD layer 127 are formed over the planarized surfaces of the source/drain contacts 125 and the second ILD layer 121. In one embodiment, the etch stop layer 123 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and other techniques of forming the etch stop layer 123, such as low pressure CVD (LPCVD), PVD, or the like, could alternatively be used. The etch stop layer 123 may be formed to a second thickness T2 of between about 5 Å and about 200 Å, such as about 50 Å.

Once the etch stop layer 123 has been formed, the third ILD layer 127 is formed over and then planarized to a desired third thickness T3 above the planarized surfaces of the source/drain contacts 125 and the etch stop layer 123 as an initial step in preparing the source/drain contacts 125 for additional processing. The third ILD layer 127 may incorporate any suitable masking and sacrificial materials, such as (but not limited to) a porous silicon dioxide ($SiO_2$) and may be deposited using a chemical vapor deposition (CVD) (e.g., PECVD or LPCVD). However, any suitable materials and any suitable processes may be used to form the third ILD layer 127. According to some embodiments, the third ILD layer 127 may be formed to the desired third thickness T3 of between about 20 nm and about 70 nm, such as about 40 nm. However, the third ILD layer 127 may be formed to any suitable thickness. Once formed, the third ILD layer 127 may be planarized using, e.g., a planarization process such as a CMP process, although any suitable process may be utilized.

Figures 1B, 1C:
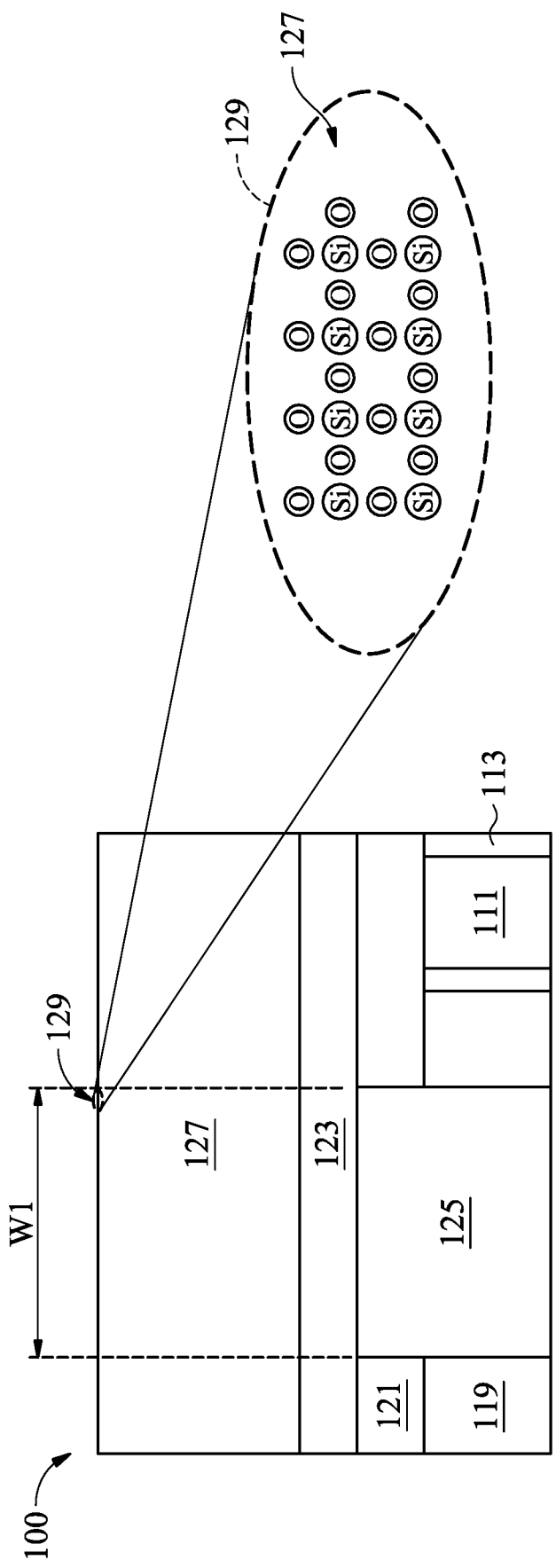

FIG. 1B illustrates a cross-sectional view through the cut line B-B' of the finFET device 100 illustrated in FIG. 1A. As such, FIG. 1B illustrates a section of the finFET device 100 over the top surface of a source/drain region 117 and cut through surfaces of a source/drain contact 125, first spacers 113, and a gate stack 111 adjacent the source/drain contact 125. Furthermore, FIG. 1B illustrates portions of the first ILD layer 119, the second ILD layer 121, the etch stop layer 123, and the third ILD layer 127 that are included within the cut section of the finFET device 100. FIG. 1B also illustrates a surface point 129 of the planarized surface of the third ILD layer 127.

FIG. 1C illustrates a magnified atomic level view of the surface point 129 of the planarized surface of the third ILD layer 127. In particular, FIG. 1C illustrates the silicon oxide (SiO) bonding of the surface materials of the third ILD layer 127.

Figures 2A, 2B:
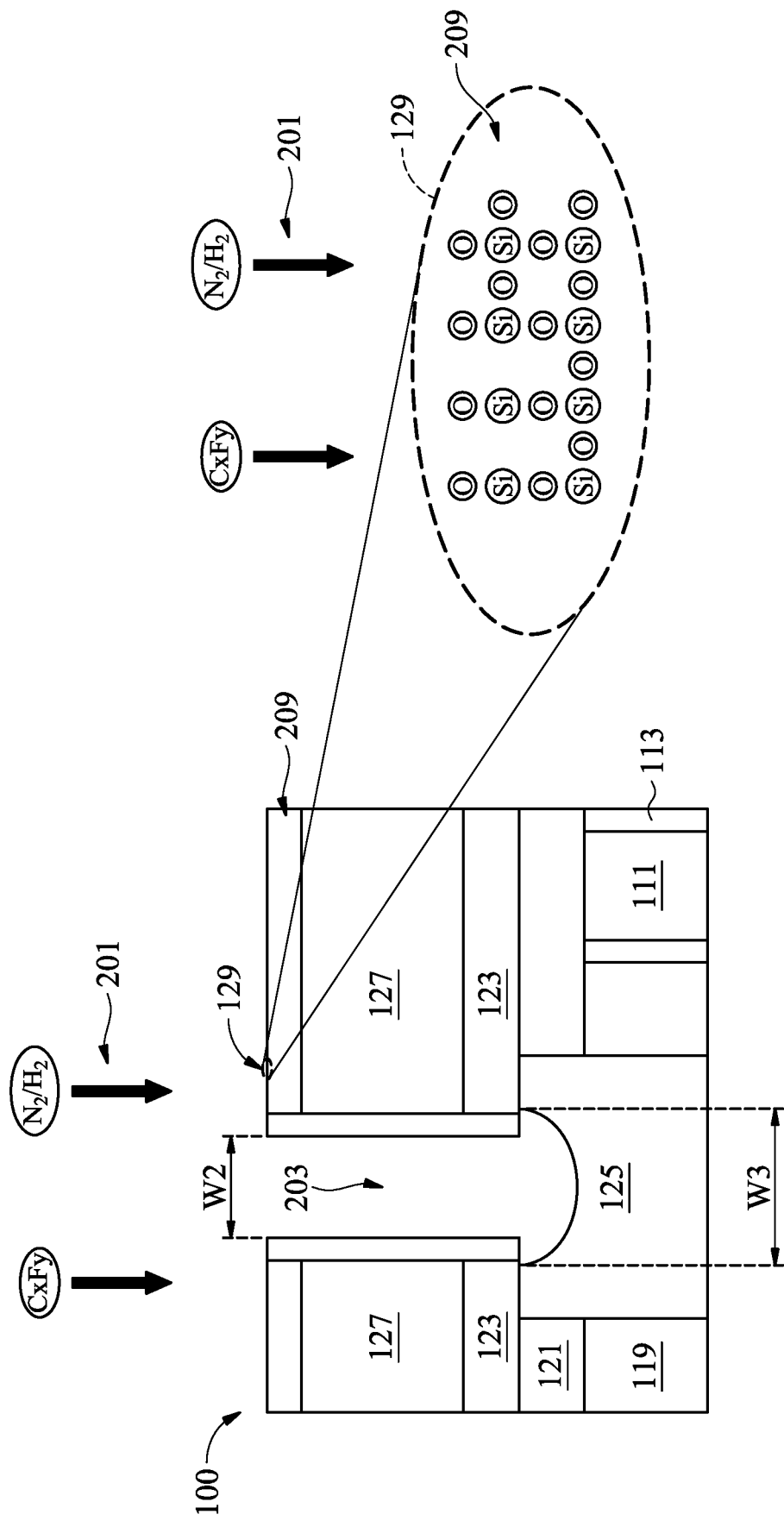

FIG. 2A illustrates, in the cross-sectional view, a second etching process 201 to form a second contact opening 203 in the finFET device 100 illustrated in FIG. 1B. In particular, FIG. 2A illustrates a patterning of both the third ILD layer 127 and the etch stop layer 123 to form the second contact opening 203 that exposes the source/drain contact 125. In an embodiment the third ILD layer 127 and the etch stop layer 123 may be patterned by initially placing and patterning a photoresist over the third ILD layer 127. In an embodiment, the photoresist may be a tri-layer photoresist that is exposed with a patterned energy in order to pattern the photoresist. The photoresist may then be developed and etched to pattern the photoresist.

Once the photoresist has been patterned, the pattern of the photoresist may be transferred to the third ILD layer 127 and to the etch stop layer 123 using the photoresist as a mask. In an embodiment the third ILD layer 127 may be patterned using the second etching process 201, which may be an anisotropic etching process such as a reactive ion etching (RIE) process, a plasma etch (e.g., plasma bombardment) using etchants such as a combination of fluorocarbons ($C_xF_y$), nitrogen ($N_2$), and/or hydrogen ($H_2$), and the like. However, any suitable process, such as a wet etching process, and any suitable reactants may be used.

The second etching process 201 may be utilized to remove the material of the third ILD layer 127 to form the second contact opening 203 in preparation of a formation of a second source/drain contact 501, as is discussed in detail below. In a particular embodiment, the second etching process 201 may be utilized to remove the material of the third ILD layer 127 to form the second contact opening 203 until the etch stop layer 123 is exposed and to form the second contact opening 203 to have a second width W2.

However, any suitable process of removal, such as a wet etch, may be utilized. In some embodiments, the second width W2 of the second contact opening 203 may be formed to a width of between about 10 nm and about 40 nm, such as about 15 nm. However, any suitable width may be used.

Additionally, in some embodiments the second etching process 201 may remove some or all of the photoresist masking the third ILD layer 127. In such embodiments portions of the third ILD layer 127 may become exposed during the second etching process 201. As such, the etchants that are present during the second etching process 201 may react with the exposed surfaces of the third ILD layer 127.

Once the etch stop layer 123 has been exposed, the pattern of the third ILD layer 127 may be transferred through the etch stop layer 123 to expose the source/drain contact 125. In an embodiment the pattern may be transferred using, e.g., a wet etch process which uses the patterned third ILD layer 127 as a mask and etchants that are selective to the materials of the etch stop layer 123. However, any suitable etchants or processes, such as a dry etch process, may also be utilized.

Additionally, if the photoresist was not fully removed during the patterning of the third ILD layer 127, the wet etch process to etch the etch stop layer 123 may remove an additional amount of the photoresist to expose the third ILD layer 127. In such embodiments portions of the third ILD layer 127 may become exposed during the wet etching portion of the second etching process 201. As such, the etchants that are present during the wet etching portion of the second etching process 201 may react with the exposed surfaces of the third ILD layer 127.

Additionally, after the etch stop layer 123 has been opened to expose the underlying source/drain contact 125, the etching may either be stopped without extending into the source/drain contact 125 or else may be continued to slightly overetch and form the second contact opening 203 to extend partially into the source/drain contact 125. As such, the second contact opening 203 may extend into the source/drain contact 125 with a contact area of the source/drain contact 125 being exposed and having a profile forming an undercut with the etch stop layer 123. In some embodiments, the second contact opening 203 may extend into the source/drain contact 125 to a second distance D2 of between about 5 nm and about 25 nm, such as less than about 20 nm and to a third width W3 of between about 20 nm and about 50 nm, such as about 25 nm. However, any suitable distance and/or any suitable width may be utilized.

If any of the photoresist remains after the wet etching portion of the second etching process 201, and once the second contact opening 203 has been formed, the photoresist may be removed using, e.g., an ashing process, whereby a temperature of the photoresist is increased until the photoresist undergoes a thermal decomposition, at which point the photoresist may be easily removed. However, any suitable removal process, such as a wet etch, may also be utilized.

FIG. 2A further illustrates damaged surfaces 209 of the third ILD layer 127 and the etch stop layer 123. In particular, at the surfaces of the third ILD layer 127 and the etch stop layer 123 intended to remain after etching, oxygen (O) atoms may be torn from these surfaces by the bombardment of the etchants (e.g., dry etch and wet etch chemical process) used during the second etching process 201. As such, silicon (Si) atoms of the silicon dioxide ($SiO_2$) material at these damaged surfaces 209 may become exposed due to the missing oxygen (O) atoms allowing for undesirable bonds to be formed between the exposed silicon (Si) atoms and other atoms (e.g., hydrogen (H)) during further processing. Furthermore, the oxide damage of these damaged surfaces 209 may interfere with the deposition process during a subsequent formation of the second source/drain contact 501 in the second contact opening 203.

FIG. 2B illustrates, in the magnified atomic level view of the surface point 129, the oxide damage to the planarized surface of the third ILD layer 127 that occurs during the second etching process 201. In particular, FIG. 2B illustrates the damaged surface of the surface point 129 is missing oxygen (O) atoms and has exposed silicon (Si) atoms as compared to the original surface illustrated in FIG. 1C.

FIG. 3A illustrates, in the cross-sectional view, a repair process 301 performed to repair the damaged surfaces 209 of the third ILD layer 127 and the etch stop layer 123. Once the second contact opening 203 has been formed, the repair process 301 uses an oxidation surface treatment (e.g., thermal oxide surface treatment, plasma oxide surface treatment, or the like) to introduce a reactant such as oxygen ($O_2$) to treat the damaged surfaces 209. As such, the reactant (e.g., oxygen) reacts with the silicon in the materials of the damaged surfaces 209 to reconstruct the silicon oxide structures of those materials to form restored surfaces 309.

In some embodiments, the repair process 301 comprises a thermal oxide treatment such as a rapid thermal oxide (RTO) treatment. However, any suitable thermal oxide treatment may be used. The finFET device 100 may be placed into a rapid thermal chamber and heated to a temperature between about 100° C. and about 400° C., such as about 200° C., while the pressure of chamber is held to between about 10 torr and about 100 torr, such as about 20 torr and the oxygen ($O_2$) may be flowed into the chamber at a flow rate of between about 1.0 slm and about 20.0 slm. During the thermal oxide treatment, in which oxygen is used as a reactant, the damaged surfaces 209 of the of the third ILD layer 127 and the etch stop layer 123 are exposed to an oxygen containing ambient environment while the materials of the damaged surfaces 209 are being heated. In some embodiments, the oxygen containing ambient environment may comprise oxygen containing molecules such as steam ($H_2O$), ozone ($O_3$), oxygen ($O_2$), combinations of these, or the like. The materials of the damaged surfaces 209 may be heated and exposed to the oxygen containing ambient environment for a time period of between about 60 sec and about 30 min, such as about 5 min, in order to reconstruct the silicon oxide structures of the materials of the damaged surfaces 209 to form the restored surfaces 309. By introducing new oxygen atoms (O) into the materials of the damaged surfaces 209, the oxygen atoms (O) bond with the exposed silicon atoms (Si). As such, the silicon oxide structures of the materials of the damaged surfaces 209 are reconstructed to form the restored surfaces 309.

In other embodiments, the repair process 301 comprises a plasma oxide treatment such as a plasma-enhanced chemical vapor deposition processes (PECVD), physical vapor deposition (PVD), or the like. According to some embodiments, the plasma oxide treatment may be conducted in a plasma chamber using inductively coupled plasma (ICP) or using capacitively coupled plasma (CCP). However, any suitable plasma oxide treatment may be used. The finFET device 100 may be placed into a plasma treatment chamber and the treatment gas (e.g., oxygen ($O_2$)) may be introduced to the plasma treatment chamber at a flow rate of between about 1000 sccm and about 9000 sccm, such as about 3000 sccm. Additionally, the plasma treatment chamber may be kept at a process temperature of between about 25° C. and about 200° C., such as about 60° C., and a process pressure of between about 0.02 torr and about 1.0 torr, such as about 0.5 torr for a period of time of between about 10 sec and about 120 sec, such as about 60 sec. However, any suitable flow rates, temperatures, and pressures may be utilized.

Once the treatment gases have been introduced into the plasma treatment chamber, the treatment gases may be ignited into the plasma. Once ignition has occurred, the plasma oxide treatment may be utilized to treat the damaged surfaces 209 in order to reconstruct the silicon oxide structures of the materials of the damaged surfaces 209 to form the restored surfaces 309. According to some embodiments, the source RF power of the plasma oxide treatment is set at 13.56 MHz to between about 1000 W and about 4000 W, such as about 2000 W and the bias RF power may be set at 13.56 MHz to between about 4000 W and about 1000 W, such as about 2000 W. The plasma oxide treatment proceeds with treating the damaged surfaces 209 for a time of between about 10 sec and about 120 sec, such as about 60 sec. However, any suitable process parameters and time periods may also be utilized.

Additionally, while specific embodiments of the oxidation surface treatment of the repair process 301 have been described above with respect to FIG. 3A, these discussions are intended to be illustrative only and are not intended to be limiting upon the embodiments. Rather, any suitable combination of treatment gases and treatment conditions may be utilized. All such combinations are fully intended to be included within the scope of the embodiments.

FIG. 3B illustrates, in the magnified atomic level view of the surface point 129, restoration of the planarized surface of the third ILD layer 127 that occurs during the repair process 301. In particular FIG. 3B illustrates, the restored surface of the surface point 129 having the silicon oxide structures reconstructed such that oxygen (O) atoms have bonded to the previously exposed silicon (Si) atoms as compared to the damaged surfaces illustrated in FIG. 2B.

FIG. 3A further illustrates an oxide layer 311 formed at the bottom of the second contact opening 203 on the exposed surface of the source/drain contact 125. During the oxidation surface treatment of the repair process 301, the treatment gases used to repair the damaged surfaces 209 also react with the materials (e.g., cobalt (Co)) of the exposed surface of the source/drain contact 125. As such, the oxide layer 311 is formed on the exposed surface of the source/drain contact 125.

FIG. 4A illustrates, in the cross-sectional view, a cleaning process 401 to remove waste produced during the second etching process 201 while forming the second contact opening 203. Once the repair process 301 has completed and the damaged surfaces 209 of the third ILD layer 127 and the etch stop layer 123 have been restored, the cleaning process 401 uses a hydrogen pre-clean treatment (e.g., hydrogen ($H_2$) plasma treatment, or the like) to remove the waste from the second contact opening 203 and from the restored surfaces 309 and to remove the oxide layer 311 from the surface of the source/drain contact 125.

In some embodiments, the cleaning process 401 comprises a hydrogen ($H_2$) plasma treatment such as a plasma-enhanced chemical vapor deposition processes (PECVD), physical vapor deposition (PVD), or the like. However, any suitable hydrogen ($H_2$) plasma treatment may be used. The finFET device 100 may be placed into a plasma treatment chamber and the treatment gas (e.g., hydrogen ($H_2$)) may be introduced to the plasma treatment chamber at a flow rate of between about 1000 sccm and about 6000 sccm, such as about 1800 sccm. Additionally, the plasma treatment chamber may be kept at a process temperature of between about 100° C. and about 400° C., such as about 150° C. and at a process pressure of between about 3 torr and about 45 torr, such as about 10 torr. However, any suitable flow rates, temperatures, and pressures may be utilized.

Once the treatment gases have been introduced into the plasma treatment chamber, the treatment gases may be ignited into the plasma. Once ignition has occurred, the hydrogen ($H_2$) plasma treatment may be utilized to remove organic material waste from various surfaces of the second contact opening 203 and the restored surfaces 309. Furthermore, the hydrogen ($H_2$) plasma treatment may be utilized to reduce the oxide layer 311 formed on the surface of the source/drain contact 125 exposed through the second contact opening 203. In an embodiment, the source RF power of the hydrogen ($H_2$) plasma treatment is set at 13.56 MHz to between about 100 W and about 800 W, such as about 300 W and also setting the bias RF power at 13.56 MHz to between about 100 W and about 800 W, such as about 300 W. The hydrogen ($H_2$) plasma treatment proceeds with removing the organic material waste and removing the oxide layer 311 for a time of between about 10 sec and about 250 sec, such as about 200 sec. However, any suitable process parameters and time periods may also be utilized.

Additionally, while a specific embodiment of the hydrogen pre-clean treatment of the cleaning process 401 has been described above with respect to FIG. 4A, these discussions are intended to be illustrative only and are not intended to be limiting upon the embodiments. Rather, any suitable combination of treatment gases and treatment conditions may be utilized. All such combinations are fully intended to be included within the scope of the embodiments.

FIG. 4B illustrates, in the magnified atomic level view of the surface point 129, the restored surface of the third ILD layer 127 during the cleaning process 401. In particular, FIG. 4B illustrates the restored surface of the surface point 129 having the silicon oxide structures reconstructed such that oxygen (O) atoms have bonded to the previously exposed silicon (Si) atoms. As such, catalytic active sites (e.g., (SiH)) are prevented from forming at the restored surfaces 309 during the cleaning process 401 when hydrogen atoms (H) are introduced to the plasma treatment chamber. By restoring the surfaces, catalytic active sites are prevented from forming. As such, a defect density of the restored surfaces 309 is reduced and a reduced level of selectivity loss is realized during a subsequent selective deposition. By performing the cleaning process 401 after the repair process 301, improved selectivity of a subsequent selective deposition on the source/drain contact 125 is also realized. Therefore, a selective deposition of tungsten (W) may be performed as a bottom-up process within the second contact opening 203 while avoiding tungsten (W) growth due to selective loss along sidewalls of the second contact opening 203. As such, defects (e.g., Via W-loss) are prevented during the bottom-up selective deposition. Furthermore, tungsten (W) growth due to selective loss blocking target regions along the planarized surfaces of the third ILD layer 127 during formation of subsequent openings is also avoided during the bottom-up selective deposition of tungsten (W). As such, defects (e.g., pattern missing and/or pattern failure) are also prevented during the bottom-up selective deposition.

Figures 5A, 5B:
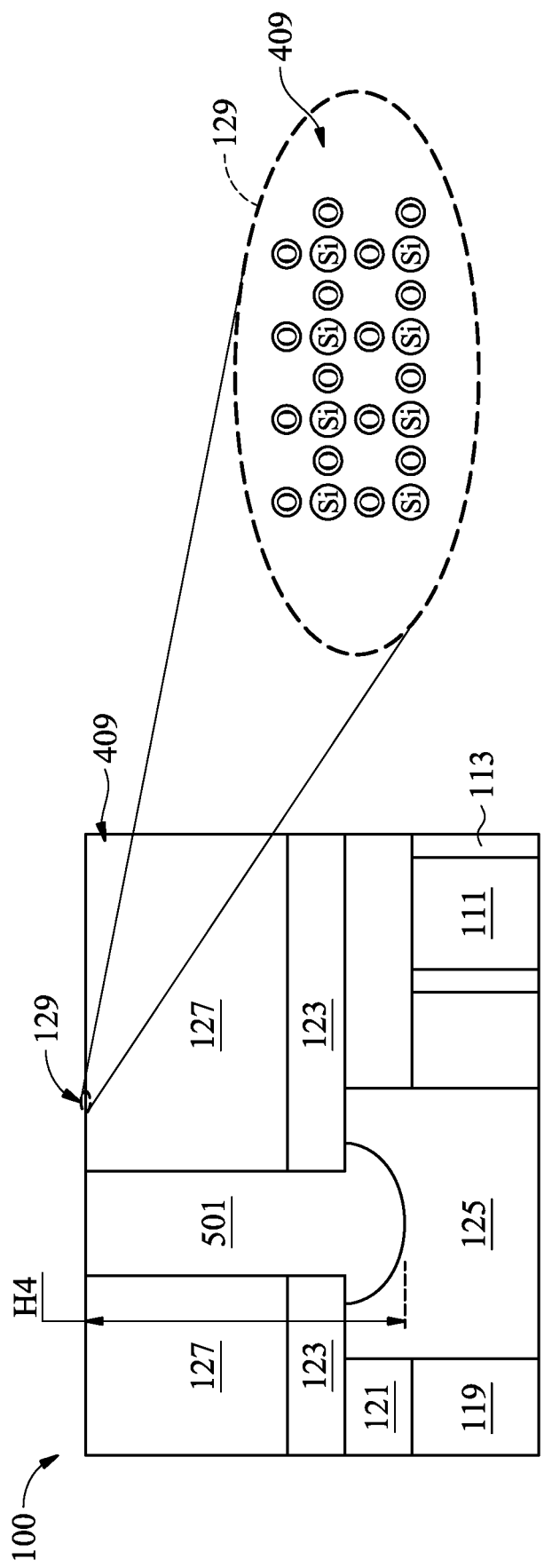

FIG. 5A illustrates, in the cross-sectional view, a deposition process to form the second source/drain contact 501 in the second contact opening 203. FIG. 5A further illustrates a planarization process to planarize the surface of the second source/drain contact 501 with the third ILD layer 127.

Once the oxide layer 311 has been removed, a conductive fill material is deposited to fill the second contact opening 203 to form the second source/drain contact 501. In an embodiment, the conductive fill material comprises a metal such as tungsten (W), alloys thereof, and the like. However, any suitable conductive fill material can be used. Furthermore, the conductive fill material may be deposited using a deposition process such as a chemical vapor deposition (CVD) to perform a bottom-up selective loss free deposition. In a bottom-up deposition, the conductive fill material has a single growth front that propagates vertically in the second contact opening 203; as such, seams are prevented from forming in the conductive fill material. Furthermore, due to the repair process 301 and the cleaning process 401 to the surfaces of the source/drain contact 125, the etch stop layer 123, and the third ILD layer 127, the deposition of the conductive fill material is performed selective loss free. As such, tungsten (W) selective loss is prevented from growing on the reconstructed silicon oxide structures along sidewalls of the second contact opening 203 and along the planar surfaces of the third ILD layer 127. Therefore, defects due to pattern missing and via tungsten (W) loss are avoided and integrated circuit yield is increased.

In an embodiment the deposition process may utilize precursors such as tungsten fluoride ($WF_6$) and hydrogen ($H_2$), although any suitable precursors such as $W(CO)_6$, $(NH_3)_3W(CO)_3$, $WCl_5$, $C_{10}H_{12}W$, $WH_2(iPrCp)_2$, the like, or a combination thereof, may be utilized. In a particular embodiment using tungsten fluoride and hydrogen as the precursors, the tungsten fluoride ($WF_6$) may be flowed into a reaction chamber at a flow rate of between about 50 sccm and about 450 sccm, such as about 100 sccm, while the hydrogen ($H_2$) may be flowed in at the same time at a flow rate of between about 1000 sccm and about 7000 sccm, such as about 2000 sccm. Additionally, the chemical vapor deposition process may be performed at a temperature of between about 200° C. and about 400° C., such as about 300° C., and at a pressure of between about 10 torr and about 300 torr, such as about 20 torr. However, any suitable process conditions may be utilized. An anneal process or reflow process may be performed after the conductive fill material is deposited in the second contact opening 203 to form the second source/drain contact 501.

Once filled or overfilled, any deposited material outside of the second contact opening 203 may be removed using a planarization process such as chemical mechanical polishing (CMP) to planarize the second source/drain contact 501 with a planarized surface 409 of the third ILD layer 127. As such, the second source/drain contact 501 is formed to a fourth height H4 of between about 25 nm and about 120 nm, such as about 50 nm. However, any suitable planarization process and any suitable thickness may be utilized.

FIG. 5B illustrates, in the magnified atomic level view of the surface point 129, the planarized surface 409 of the third ILD layer 127. As shown in FIG. 5B, the planarized surface of the surface point 129 comprises fully reconstructed silicon oxide bonds.

Figures 6A, 6B:
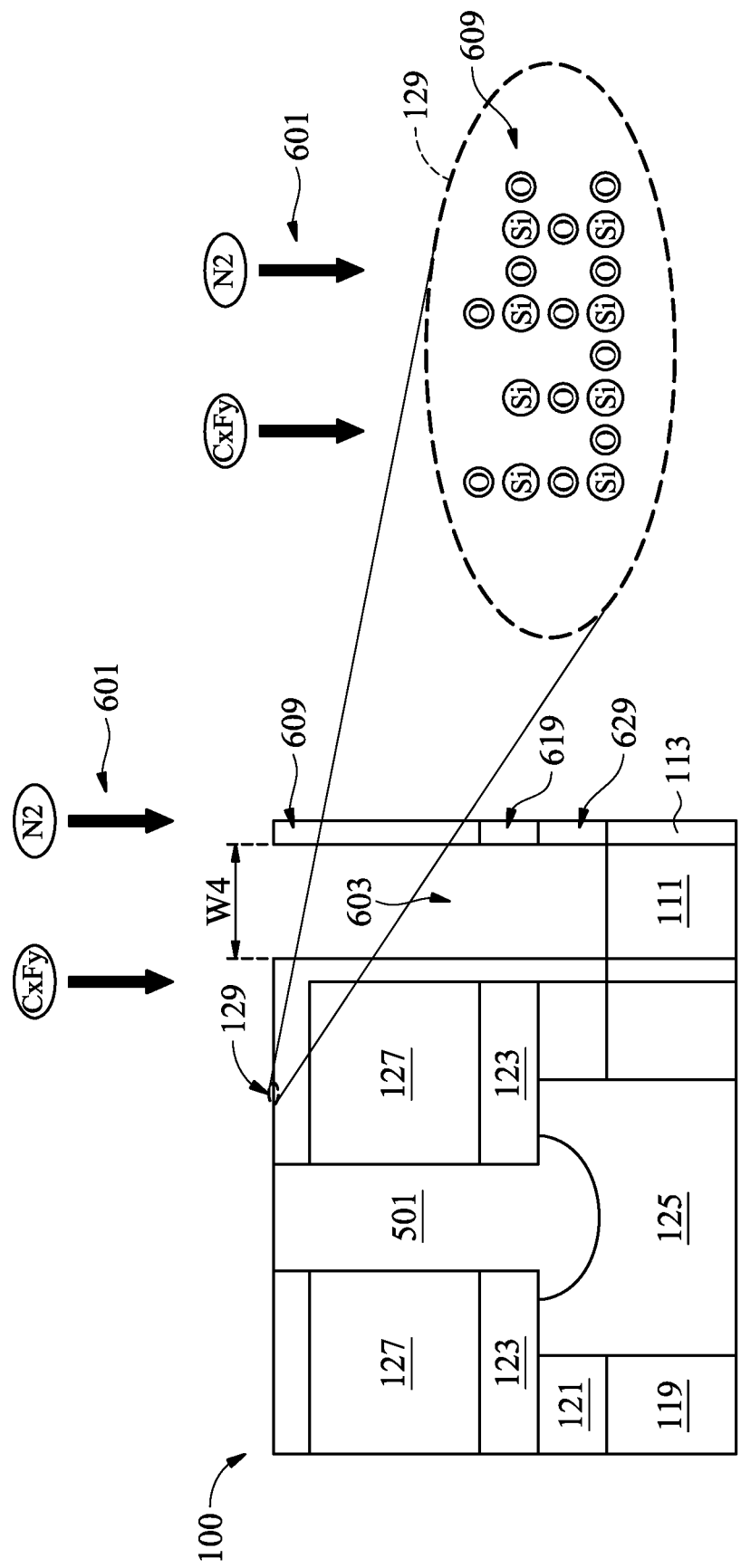

FIG. 6A illustrates, in the cross-sectional view, a third etching process 601 to form a third contact opening 603 in the finFET device 100 illustrated in FIG. 5B. In particular, FIG. 6A illustrates a patterning and removal of materials of the third ILD layer 127, the etch stop layer 123 and the second ILD layer 121 to form the third contact opening 603 that exposes a surface of the gate stack 111. In some embodiments, the third etching process 601 used to form the third contact opening 603 comprises placing and patterning a photoresist (e.g., tri-layer photoresist), as discussed above, over the planarized surface 409 of the third ILD layer 127 of FIG. 5A. Once the photoresist has been patterned, one or more anisotropic etching processes and etchants, as set forth above with regard to FIG. 2A, may be used in the third etching process 601 to form the third contact opening 603. In some embodiments, materials of the third ILD layer 127 are removed using the patterned photoresist as a mask, materials of the etch stop layer 123 are removed using the patterned third ILD layer 127 as a mask, and materials of the second ILD layer 121 are removed using the patterned etch stop layer 123 as a mask. However, any suitable removal processes and any suitable reactants may be used. In a particular embodiment, the third etching process 601 may be utilized to form the third contact opening 603 until the gate stack 111 is exposed and to form the third contact opening 603 to have a fourth width W4. In some embodiments, the fourth width W4 of the third contact opening 603 may be formed to a width of between about 10 nm and about 40 nm, such as about 20 nm. However, any suitable width may be used. Either during the third etching process 601 or after the third etching process 601 has been completed, the photoresist may be removed using, e.g., an ashing process, as explained above. However, any suitable removal process, such as a wet etch, may also be utilized.

FIG. 6A further illustrates damaged surfaces 609 of the third ILD layer 127, damaged surfaces 619 of the etch stop layer 123, and damaged surfaces 629 of the second ILD layer 121. In particular, as explained above, oxygen (O) atoms may be torn from these damaged surfaces during the third etching process 601 exposing silicon (Si) atoms of the silicon dioxide ($SiO_2$) materials at these damaged surfaces 609, 619, and 629 allowing for undesirable bonds to be formed between the exposed silicon (Si) atoms and other atoms (e.g., hydrogen (H)) during further processing.

Once the first gate stack 111 has been exposed, a cleaning process such as the cleaning process 401 describe above with regard to FIG. 4A may be performed. As such, the waste from the materials removed from the third contact opening 603 during the third etching process 601 is removed and any oxide layer, if formed, on the surface of the gate stack 111 is also removed.

FIG. 6B illustrates, in the magnified atomic level view of the surface point 129, the oxide damage to the planarized surface of the third ILD layer 127 that occurs during the third etching process 601. In particular, FIG. 6B illustrates the damaged surface of the surface point 129 is missing oxygen (O) atoms and has exposed silicon (Si) atoms as compared to the original surface illustrated in FIG. 5B.

Figures 7A, 7B:
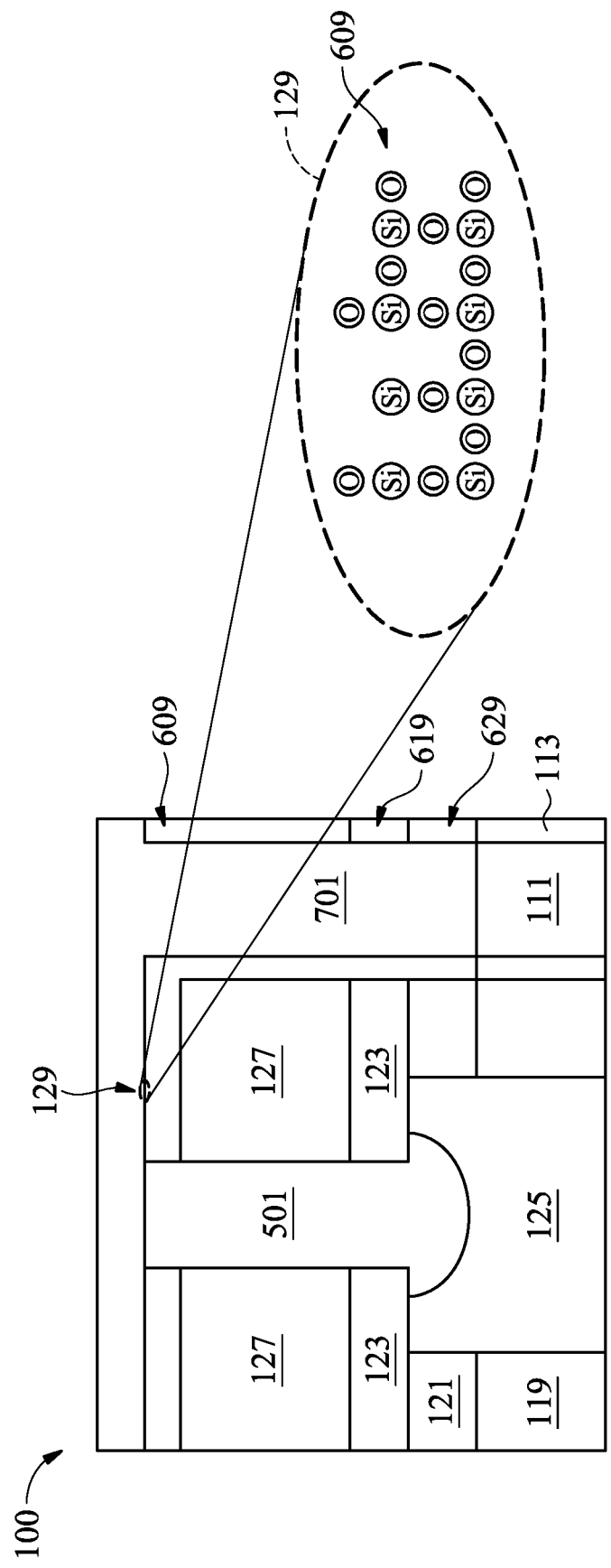

FIG. 7A illustrates, in the cross-sectional view, the formation of a contact plug 701. Once the third contact opening 603 has been formed, the contact plug 701 may be formed in the third contact opening 603.

In an embodiment, the contact plug 701 may be formed to fill and/or overfill the third contact opening 603. Furthermore, the contact plug 701 may be formed using any suitable deposition process, such as CVD, PVD, ALD, electroplating, electroless plating, combinations of these, or the like, using materials such as copper, tungsten, combinations of these, or the like. In other embodiments, the contact plug 701 may be formed from any of the conductive fill materials using any of the metals (e.g., copper (Cu), copper alloy, or the like), deposition processes, annealing steps, and selective etch processes as described above with regard the source/drain contact 125 in FIG. 1A. However, any suitable material and any suitable formation process may be utilized.

Furthermore, the contact plug 701 can include an optional adhesion layer (e.g., Ti, etc.), an optional barrier layer (e.g., TiN, etc.) on the optional adhesion layer, and the conductive fill material (e.g., tungsten (W), copper (Cu) or the like) on the optional barrier layer. The contact plug 701 can also be made without using the optional barrier layer with the conductive fill material being made from a less diffusive metal such as tungsten (W), molybdenum (Mo), ruthenium (Ru), or the like.

FIG. 7A further illustrates, according to some embodiments, the conductive fill material may be deposited to form the contact plug 701 without performing a repair process, as described above, to restore the damaged surfaces 609, 619 and 629. As such, the damaged surfaces 609 of the third ILD layer 127, the damaged surfaces 619 of the etch stop layer 123, and the damaged surfaces 629 of the second ILD layer 121, remain along the planarized surfaces of the third ILD layer 127 and remain along the sidewalls of the contact plug 701.

FIG. 7B illustrates, in the magnified atomic level view of the surface point 129, the oxide damage to the planarized surface of the third ILD layer 127 occurs during the third etching process 601. In particular, FIG. 7B illustrates the damaged surface of the surface point 129 is missing oxygen (O) atoms and has exposed silicon (Si) atoms as compared to the original surface illustrated in FIG. 5B.

Figures 8A, 8B:
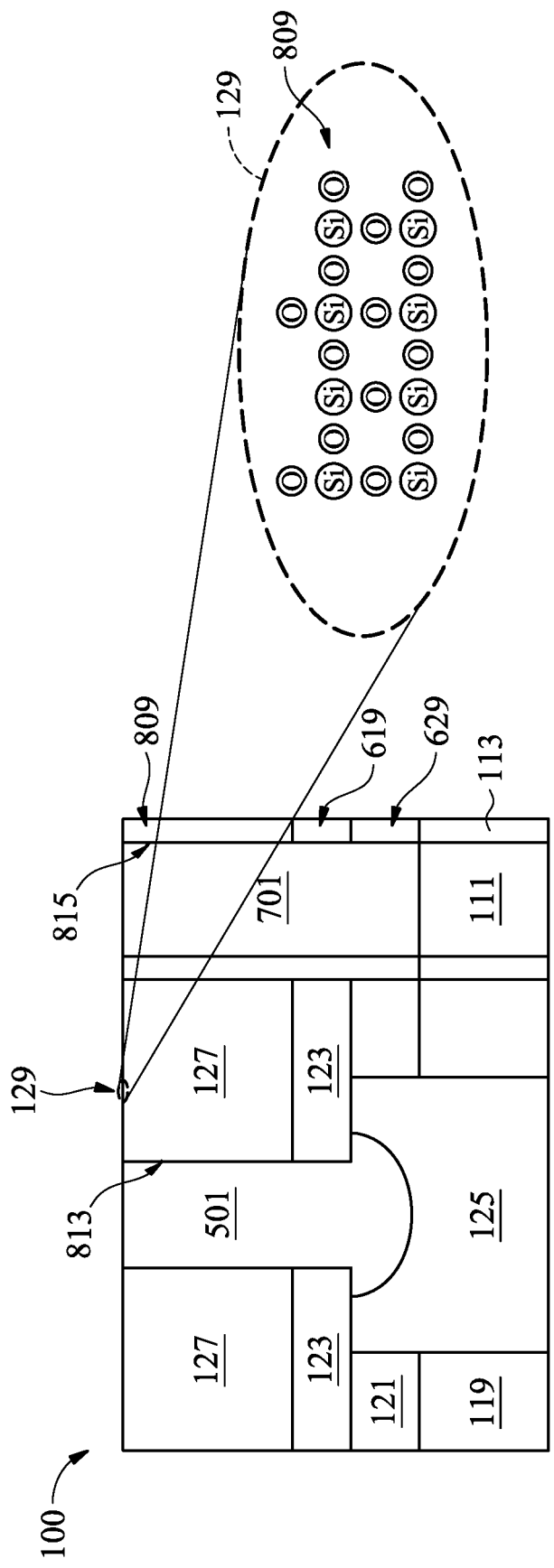

FIG. 8A illustrates, in the cross-sectional view, a planarization of the finFET device 100. Once the second source/drain contact 501 (and associated sidewalls 813) and the contact plug 701 (and associated sidewalls 815) have been formed, the finFET device 100 may be planarized using a suitable planarization process (e.g., chemical mechanical planarization (CMP)), as described above. In some embodiments, the finFET device 100 is planarized above the fins 107 such that the damaged surfaces 609 of the third ILD layer 127 are substantially removed from the planarized surface of the finFET device 100 and only damaged surface portions 809 of the third ILD layer 127 disposed along sidewalls 815 of the contact plug 701 remain in the planarized surface of the finFET device 100. However, any suitable height may be used.

FIG. 8B illustrates, in the magnified atomic level view of the surface point 129, the planarized surface of the finFET device 100, after the damaged surfaces 609 at the planarized surface of the third ILD layer 127 have been substantially removed. As shown in FIG. 8B, the planarized surface of the finFET device 100 of the surface point 129 comprises fully constructed silicon oxide bonds.

Once the second source/drain contact 501 and the contact plug 701 have been formed and planarized with a surface of the third ILD layer 127 to the desired fifth height H5, the finFET device 100 is ready for additional processing. In some embodiments, the additional processing may include forming one or more metallization layers over the second source/drain contacts 501 and the contact plug 701 in order to form functional circuitry, forming contact pads in electrically connection with the metallization layer, and packaging the finFET device 100 so that the finFET device 100 may be attached to other external devices.

Additionally, while specific embodiments of repairing surfaces of dielectric surfaces and specific embodiments of selective metal deposition have been described above with respect to forming contacts of finFET devices, these discussions are intended to be illustrative only and are not intended to be limiting upon the embodiments. Rather, any of the processes disclosed herein may be extended to all processes of surface repair and applications of selective metal deposition for any device, for example, processes used during formation of metallic structures, such as metal gates, contacts, inter metal or the like of any technology generation (e.g., node 7 (N7), node 5 (N5), node 3 (N3) and beyond).

All such combinations are also fully intended to be included within the scope of the embodiments.

Embodiments disclosed herein are directed towards methods of forming contacts for source/drain regions and towards the formation of a contact plug for a gate stack of a finFET device. In particular, embodiments are disclosed for methods of etching a contact opening through a dielectric layer (e.g., $SiO_2$ layer) to expose surfaces of a source/drain contact. The methods further comprise repairing silicon oxide structures along sidewall surfaces of the contact opening and repairing silicon oxide structures along planar surfaces of the dielectric layer. As such, defects including via selective loss defects during subsequent deposition of conductive fill materials and pattern miss defects during subsequent etching of other contact openings are avoided. Once the surfaces have been repaired, a cleaning process may be performed to remove waste produced during etching from the contact opening and from the planar surfaces of the dielectric layer, according to some embodiments. The methods further comprise performing a selective bottom-up deposition of conductive fill material comprising tungsten (W) to form the source/drain contact. Once the source/drain contact has been formed, the contact plug may be formed over the gate using one or more of the etching, repairing, cleaning and deposition processes, according to some embodiments.

According to some embodiments, a method includes forming a first opening through a dielectric layer over a first source/drain contact, sidewalls of the first opening being damaged; repairing damage on the sidewalls of the first opening utilizing an oxidizing environment; and depositing a first conductive fill material in the first opening using a directional deposition process. In some embodiments, the method includes reconstructing silicon oxide structures at the sidewalls of the first opening. In some embodiments, the method includes forcing oxygen atoms to bond to exposed silicon atoms at the sidewalls of the first opening. In some embodiments, the method includes performing an anisotropic reactive ion etching process using a fluorocarbon molecule as a first precursor and using a nitrogen molecule as a second precursor. In some embodiments, the method includes, after the reconstructing the silicon oxide structures and before the depositing the first conductive fill material, performing a hydrogen plasma treatment to remove an oxide layer from a surface of the first source/drain contact through the first opening. In some embodiments, the method includes depositing tungsten. In some embodiments, the method further includes, after depositing the first conductive fill material in the first opening, forming a second opening through the dielectric layer over a gate electrode, surfaces on sidewalls of the second opening being damaged; and depositing a second conductive fill material in the second opening without repairing damage on the sidewalls of the second opening.

According to some embodiments, a method includes etching a first via opening through an insulating layer to expose a surface of a conductive contact to a source/drain region of a finFET device, sidewall surfaces of the first via opening being damaged during the etching the first via opening; restoring damage on the sidewalls of the first via opening; and forming a conductive plug through the first via opening and in physical contact with the conductive contact using a bottom-up deposition process. In some embodiments, the method includes performing an oxidation surface treatment. In some embodiments, the method includes performing a rapid thermal oxide treatment. In some embodiments, the method includes performing an anisotropic plasma etching process using a combination of fluorocarbon and hydrogen as an etchant. In some embodiments, the method further includes performing a plasma oxide surface treatment. In some embodiments, the method further includes, after the restoring the damage and before the forming the conductive plug, performing a hydrogen plasma treatment to remove an oxide layer from a surface of the conductive contact through the first via opening. In some embodiments, the method further comprises after forming the conductive plug, forming a second via opening through the insulating layer over a gate electrode, sidewall surfaces of the second via opening being damaged; and depositing a second conductive fill material in the second via opening without restoring damage on the sidewalls of the second via opening.

According to some embodiments, a method includes forming a first metallization layer over a source/drain region of a finFET device; depositing an etch stop layer over the first metallization layer; depositing an isolation layer over the etch stop layer; etching a first via opening through the isolation layer and the etch stop layer to expose a contact area of the first metallization layer, silicon oxide structures at sidewall surfaces of the first via opening being damaged during the etching the first via opening; reconstructing the silicon oxide structures at the sidewall surfaces of the first via opening; depositing a first metallic pillar in the first via opening and in physical contact with the contact area of the first metallization layer; and after forming the first metallic pillar, forming a second metallic pillar through the isolation layer and in physical contact with a gate electrode of the finFET device. In some embodiments, the method includes an overetch into the first metallization layer, wherein the overetch forms an undercut between the first metallization layer and a bottom surface of the etch stop layer. In some embodiments, the method includes performing an oxidation surface treatment on the sidewall surfaces of the first via opening. In some embodiments, the method includes performing a rapid thermal oxide treatment on the sidewall surfaces of the first via opening. In some embodiments, the method further includes, after the reconstructing the silicon oxide structures and before the depositing a first metallic pillar, performing a hydrogen plasma treatment to remove an oxide layer from the first metallization layer through the first via opening. In some embodiments, the method further includes forming a second via opening and exposing a contact area on the gate electrode; and depositing a second metallic pillar in the second via opening and in physical contact with the contact area of the gate electrode without reconstructing silicon oxide structures at sidewall surfaces of the second via opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first source/drain contact;
    forming a gate electrode;
    forming a dielectric layer disposed over the first source/drain contact and the gate electrode;
    forming a first opening through the dielectric layer over the first source/drain contact, the first opening comprising sidewalls;
    repairing damage on the sidewalls utilizing an oxidizing environment; and
    forming a first conductive structure in the first opening over the first source/drain contact and a second conductive structure in a second opening over the gate electrode, wherein the repairing causes a first oxygen percentage of a sidewall of the first conductive structure to be higher than a second oxygen percentage of a sidewall of the second conductive structure, wherein both the first oxygen percentage and the second oxygen percentage are greater than zero, wherein the first conductive structure comprises a single material throughout the first conductive structure.

2. The method of claim 1, wherein the forming the first conductive structure comprises a first conductive fill material of tungsten.

3. The method of claim 2, wherein the forming the second conductive structure comprises a second conductive fill material of tungsten.

4. The method of claim 1, wherein the forming the dielectric layer comprises silicon oxynitride.

5. The method of claim 1, wherein the forming the dielectric layer comprises silicon carbide.

6. The method of claim 1, wherein the forming the dielectric layer comprises silicon oxide.

7. The method of claim 1, wherein the forming the first conductive structure forms the first conductive structure to extend below the dielectric layer.

8. A method, comprising:
    forming a gate electrode over a substrate;
    forming a first opening through a dielectric layer over a first source/drain contact, sidewalls of the first opening being damaged, wherein the forming the first opening undercuts the dielectric layer within the first source/drain contact;
    forming a second opening through the dielectric layer to expose the gate electrode;
    repairing damage on the sidewalls of the first opening utilizing an oxidizing environment;
    depositing a first conductive fill material in the first opening using a directional deposition process; and
    depositing a second conductive fill material in the second opening over the gate electrode, wherein a first oxygen percentage of a sidewall of the first conductive fill material is higher than a second oxygen percentage of a sidewall of the second conductive fill material, wherein the second oxygen percentage is greater than zero.

9. The method of claim 8, wherein the first conductive fill material is tungsten.

10. The method of claim 8, wherein the repairing the damage is performed with a thermal oxide treatment.

11. The method of claim 10, wherein the thermal oxide treatment is performed at least in part at a temperature between about 100° C. and about 400° C.

12. The method of claim 8, wherein the depositing the first conductive fill material deposits a portion of the first conductive fill material between the dielectric layer and the first source/drain contact.

13. The method of claim 8, wherein the dielectric layer is silicon oxide.

14. A method, comprising:

forming a gate electrode;

forming a first source/drain contact;

disposing a dielectric layer over the first source/drain contact and the gate electrode;

forming a first opening in the dielectric layer over the first source/drain contact;

repairing damage on sidewalls of the first opening utilizing an oxidizing environment;

forming a second opening over the gate electrode in the dielectric layer;

disposing a first conductive fill material in the first opening to form a first conductive structure in the dielectric layer and over the first source/drain contact, the first conductive structure undercutting a portion of the dielectric layer; and disposing a second conductive fill material in the second opening to form a second conductive structure in the dielectric layer and over the gate electrode, wherein a first oxygen percentage of a sidewall of the first conductive structure is higher than a second oxygen percentage of a sidewall of the second conductive structure, wherein the second oxygen percentage is greater than zero.

15. The method of claim 14, wherein disposing the dielectric layer disposes silicon and oxygen.

16. The method of claim 15, wherein the disposing the dielectric layer further disposes nitrogen.

17. The method of claim 14, wherein the disposing the dielectric layer disposes silicon oxide.

18. The method of claim 14, wherein the second conductive structure has a constant thickness.

19. The method of claim 14, wherein the first conductive structure has a first width adjacent to the first source/drain contact and a second width adjacent to the dielectric layer, the first width larger than the second width.

20. The method of claim 14, wherein the first conductive fill material and the second conductive fill material comprise tungsten.

* * * * *